United States Patent

Freitag

[15] 3,691,430

[45] Sept. 12, 1972

[54] CIRCUIT BOARD ASSEMBLY WITH POSITIVE LATCH

[72] Inventor: Lawrence F. Freitag, Bayside, Wis.

[73] Assignee: Allen-Bradley Company, Milwaukee, Wis.

[22] Filed: April 29, 1971

[21] Appl. No.: 138,419

[52] U.S. Cl. ................317/101 DH, 211/41, 339/17, 339/91

[51] Int. Cl. ...............................................H02b 1/02

[58] Field of Search.......317/101 DH; 211/41; 339/17 LM, 339/91 R, 27 M, 45 R

[56] References Cited

UNITED STATES PATENTS

| | | | |
|---|---|---|---|
| 3,311,863 | 3/1967 | Beale | 317/101 DH |
| 3,451,034 | 6/1969 | Beale | 211/41 |
| 3,476,258 | 11/1969 | Dorsett | 211/41 |
| 3,360,689 | 12/1967 | Haury | 317/101 DH |

*Primary Examiner*—David Smith, Jr.

*Attorney*—Thomas W. Ehrmann and Arthur H. Seidel

[57] ABSTRACT

A circuit board assembly has a series of sets of parallel spaced and oppositely disposed guide rails with integral mounting portions that are snapped on and partially encircle support bars. Each set of guide rails supports an electrical connector for a circuit board at one end. Mirrored longitudinal channels are formed in the guide rails. Latch members are adapted to be pivotally affixed to said support bars between adjacent sets of said guide rails in order that they may be moved to an open or closed position. When in an open position the latch members allow the circuit boards to be individually inserted into the mirrored channels of the sets of guide rails, and into engagement with the corresponding electrical connector. The latch members are then pivoted to a closed position with overlying portions of the latch members obstructing the channels of the guide rails to prevent unintentional removal of the inserted circuit boards.

7 Claims, 3 Drawing Figures

PATENTED SEP 12 1972

3,691,430

INVENTOR
LAWRENCE F. FREITAG

BY Thomas W. Ehrmann

ATTORNEY

CIRCUIT BOARD ASSEMBLY WITH POSITIVE LATCH

BACKGROUND OF THE INVENTION

1. Field of the Invention

This invention relates to circuit board assemblies, and particularly to an assembly including a releasable positive latch to prevent removal of individual circuit boards.

2. Description of the Prior Art

It is common practice to assemble a series of individual plug-in circuit boards into a rack which supports and holds them. One of the desirable features of such an assembly is that it provides for insertion or removal of the individual boards into and out of the rack as desired; and it therefore permits ready access to the boards for testing, modification, or replacement. While ease of insertion and removal is necessary, accidental disengagement or loosening to the extent of breaking the electrical connection to the board is definitely undesirable. Such accidental loosening or disengagement may occur when the rack is being used in an environment which subjects the rack to vibrations.

Accordingly, it is necessary to provide some means for restraining each circuit board in place within the rack until it is desired to remove that board. The obvious solution is to directly connect the boards to the rack by means of screws, or pins, or any other means which must first be disassembled before the board can be removed. However, to do so detracts from the ease of insertion and removal.

One proposed solution to the problem of restraint utilizes a restriction in the channeled track of a guide rail which receives and supports the side edge of the board. The restriction must be passed by the trailing edge of the board before the circuit board is fully seated and at first proves effective in maintaining the position of the board. However, after several insertions and removals of the circuit board the restriction loses its effectiveness because of wear on both the restriction and the cooperating portions of the circuit board. Another proposed solution is shown in U.S. Pat. No. 3,360,689 issued Dec. 26, 1967 to P. T. Haury, wherein a hinged member is adapted to close off the front opening to the rack. This solution suffers from the defect that the entire hinge member must be moved out of the way when it is desired to gain access to any one of the circuit boards.

The present invention solves the problem of preventing accidental withdrawal of inserted circuit boards by providing a simple latch member which can be snapped onto a support rod and which, when in a closed position, positively engages a projection of the assembly and blocks withdrawal of a circuit board. Preferably, one latch member prevents withdrawal of two adjacent circuit boards and also functions as a spacer in the assembly between the adjacent circuit boards.

SUMMARY OF THE INVENTION

The invention resides in the combination with a circuit board assembly of a latch member which is pivotally mounted on a support bar for a channeled circuit board guide rail, and which latch member is movable between an open position and a closed position in which a hook on the latch member engages with the end of the guide rail and a ledge on the latch member overlies the end of the guide rail channel to prevent withdrawal of a circuit board inserted in the guide rail.

The invention also resides in such a circuit board assembly in which each latch member is adapted to engage and cooperate with a pair of guide rails disposed on opposite sides of the latch member; in providing a yieldable mounting portion on the latch member which may be snapped in place upon the support bar for ease of assembly or replacement; and in employing the yielding of the mounting portion to effect the engagement and disengagement of the latch member hook.

It is the object of this invention to provide a circuit board assembly that permits speedy insertion or removal of circuit boards as well as a means for holding the boards in position once they are inserted. The embodiment shown is highly effective for these purposes. At the same time, it is relatively simple and inexpensive to manufacture, assemble, maintain and use. Other objects and advantages will appear from the description to follow.

DESCRIPTION OF THE PREFERRED EMBODIMENT

Figure 1:
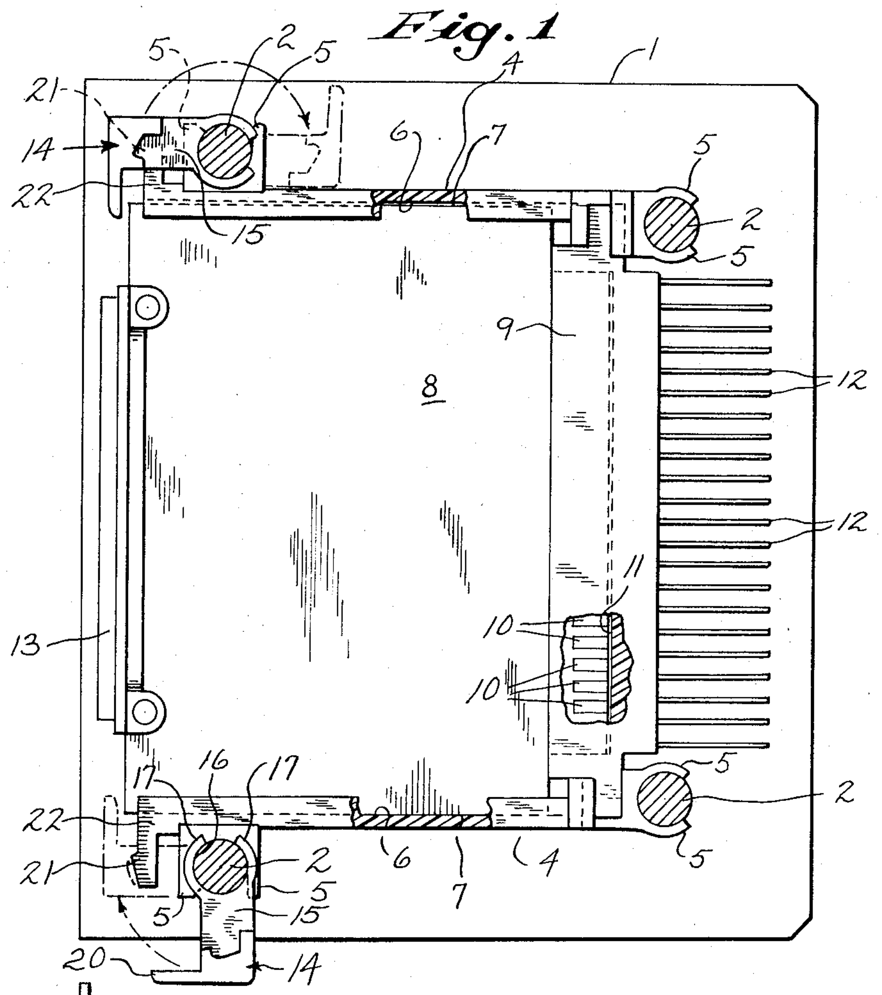
FIG. 1 is a view in vertical elevation, with parts broken away and in section, of a circuit board assembly including a circuit board inserted in a rack and showing latch members in both open and closed positions.
Figure 2:
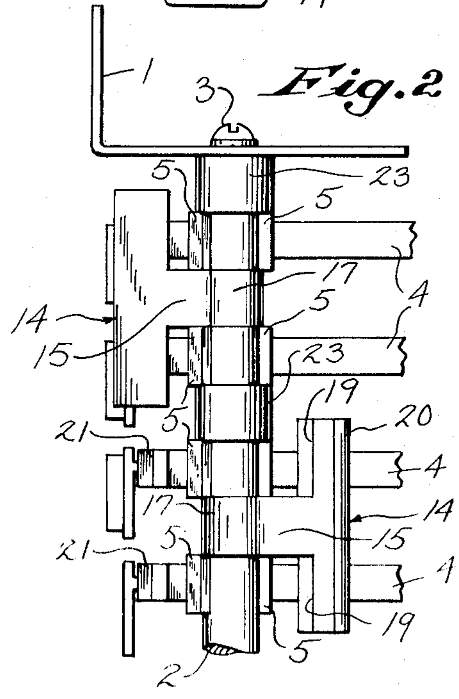
FIG. 2 is a partial plan view of a printed circuit board assembly of FIG. 1 showing the front portion of the circuit board rack, and latch members in both open and closed positions.
Figure 3:
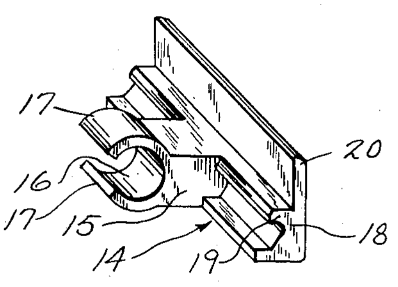
FIG. 3 is a view in perspective of a latch member of the invention.

Referring to FIG. 1, the circuit board assembly includes two end plates 1, one of which is shown, which mount four support rods 2. The support rods 2 are positioned in a parallel spaced apart relationship bridging the end plates 1, and are attached thereto by screws 3 which are fitted through holes in an end plate 1 and are threaded into the ends of the support rods 2 (see FIG. 2). Connected to the support rods 2 are elongate guide rails 4 operatively divided into spaced apart sets. Each set of guide rails 4 consists of an upper and a lower guide rail 4. The four support rods 2 are divided into two spaced apart pairs, the upper pair for securing the upper guide rails 4, and the lower pair secures the lower guide rails 4. The length of the support rods 2 may be varied depending upon the number of sets of guide rails 4 that are to be contained between the end plates 1.

Integrally formed on the guide rails 4 are mounting portions each comprised of a pair of incurved, yieldable, opposed clamping fingers 5 adapted to snugly fit around a support rod 2. Each of the guide rails 4 has two such pairs of clamping fingers 5, one pair projecting laterally adjacent the front of the guide rails 4 and the other pair projecting rearwardly of the guide rails 4. A longitudinal channel 6 is formed along each guide rail 4 for substantially the entire length of the rail. When the guide rails 4 are installed on the support bars 2 the channels 6 are disposed inwardly of the assembly with the channels 6 of each set of guide rails 4 opposing each other to form mirrored tracks or channels. The mirrored channels 6 are adapted to receive the top and bottom edges 7 of a printed circuit board 8 which may be slid into place through the open front end of the channels 6.

The electrical circuit connections between the circuit board 8 and the board assembly are provided by an electrical connector 9 held in position between the set of guide rails 4, or in any other suitable manner. The circuit boards 8 are conventionally provided with metal terminal strips 10 along the leading edge of the board. The leading edge of the circuit board is received in a slot 11 wherein the strips 10 engage electrical contacts (not shown) within the connector 9 in a known manner. The connector contacts are in turn electrically connected to spade-like terminals 12 which extend from the connector 9. The circuit board 8 may be provided with a handle 13 to facilitate installation or removal of the board 8.

A plurality of latch members 14 are mounted on the support rods 2 in such manner that a latch member 14 is interposed between each adjacent pair of sets of guide rails 4 at both the top and bottom, as viewed in FIG. 1. The latch members 14 are each integrally formed, and are comprised of a stem 15 having a mounting portion 16 at one end which consists of incurved, yieldable, opposed clamping fingers 17 adapted to snap around a support rod 2. The opposite end of the stem 15 is formed with a latch portion 18 having a pair of hooks 19 and a ledge 20. The hooks 19 extend outward on both sides of the stem 15 and conform generally to the shape of lugs 21 formed on arms 22 which project outwardly from the front end of the guide rails 4 in a direction opposite the channels 6. The ledge 20 extends the full width of the latch portion 18.

The latch members 14, as well as the guiderails 4, are preferably formed of a thermoplastic molding compound, such as a modified polyphenylene oxide. Such material has excellent dimensional stability and is relatively rigid. Accordingly, the mounting portion 16 of each latch member 14 depends upon its configuration for its ability to be snapped onto the support rod 2 and not upon any inherent flexibility of the material from which it is made. The latch members 14 are easily but securely coupled to one of the support rods 2 by forcing the ends of the clamping fingers 17 apart. The relatively thin clamping fingers 17 will yield to permit the passage of the support bar 2 past the ends of the clamping fingers 17 and into the circular space formed by the incurve of the fingers 17.

The upper and lower guide rails 4 that comprise a set must be aligned an equal distance from one of the end plates 1, and additional sets of guide rails 4 must be equally spaced apart from each other. This alignment and spacing is accomplished by spacers 23 disposed on the support bars 2 between adjacent sets of guide rails 4 and between the end plates 1 and the end sets of guide rails 4. The latch members 14 function as spacers between the adjacent pairs of sets with which they are associated by making the width of the mounting portion 16 of the latch members 14 equal to the width of the spacers 23. When the guide rails 4 are thusly aligned and spaced apart any circuit board 8 of the correct dimensions may be slidably inserted into the outer ends of and be guided into the assembly by the longitudinally formed channels 6 of the sets of guide rails 4 until the leading edge of each inserted circuit board 8 seats in its respective electrical connector 9.

With the structure as described, the circuit board 8 is held in three directions by the connector 9 and the pair of guide rails 4. However, without the use of the latch members 14 there is nothing to restrain the circuit board 8 in the fourth direction and the circuit board 8 can be pulled out or vibrated loose from the connector 9 to the extent that the board is electrically disconnected from the connector 9. The latch members 14 serve to restrain movement of the board 8 in this fourth direction and to prevent accidental disconnection of the board 8 from the connector 9.

FIG. 1 illustrates the open and closed positions of the latch members 14. The upper latch member 14 is shown in solid lines in its closed position and its open position is indicated in dotted lines. The lower latch member 14 is shown in solid lines in its open position and its closed position is indicated by dotted lines. As may be seen, when the latch members 14 are in their open positions, circuit boards 8 may be inserted and removed as desired.

As the latch members 14 are each pivoted from their open position to their closed position, the hooks 19 slide over and engage the lugs 21 that protrude from the arms 22 of the guide rails 4 between which the latch members 14 are disposed. In this way the hooks 19 positively lock the latch members 14 in a closed position. When the latch members 14 are in this closed position, the ledge 20 of each latch member 14 extends in front of the channels 6 of the guide rails 4 to which the latch member 14 is engaged. To unlock the latch members 14 from this position it is necessary to apply pressure in an outward direction on the end of the ledge 20 in order that the hooks 19 disengage from the lugs 21, whereupon the latch members 14 may be pivoted to an open position, unblocking the front of the channels 6. As will be seen in FIG. 1, the lugs 21 project into the path of travel of the hooks 19 of the latch member 14 as the latch member 14 is pivoted between its open and closed positions. However, the clamping fingers 17 of the latch member 14 will yield sufficient to permit the hooks 19 to be forced past the lugs 21. The clamping fingers 17 thereby function not only to mount the latch member 14 on the support bar 2 but also as the point of yield in the engagement and disengagement of the latch member 14 with the guide rails 4. The normal resistance of the clamping fingers 17 to distortion also functions to securely lock the hooks 19 onto the lugs 21 when engaged, and this resistance can be overcome only by the deliberate application of an external force on the latch member 14.

By pivotally connecting the latch members 14 to the support rods 2, the outer openings of the guide rail channels 6 may be easily blocked or unblocked by the ledges 20 simply through the pivotal movement of the latch members 14. When the latch members 14 are in an open position, there is no obstacle to the insertion of the circuit boards 8 into the channels 6. The circuit boards 8 slide smoothly into the board assembly along the tracks formed by the channels 6.

Once the boards 8 are in the home position in the assembly the latch members 14 may be quickly pivoted into their closed position to prevent withdrawal of the inserted boards 8. Due to the positive engagement of the latch members 14, they will remain in front of the channels 6, although force may be applied to the latch members 14 by one or both of the circuit boards 8 with which each latch member 14 cooperates. It has been found that the use of a latch member 14 in cooperation with two sets of guide rails 4 increases the holding effect of the latch member 14. Any force exerted by a circuit board 8 on a ledge 20 to one side of the stem 15 which would tend to disengage the hook 19 on that side of the stem 15 is counteracted by the engagement of the hook 19 on the other side of the stem 15 with its cooperating lug 21. Thus, such a force to one side of the stem 15 will actually cause the latch member 14 to engage with greater force.

The ledge 20 does not need to be in contact with an inserted circuit board 8 when the latch member 14 is closed. Rather, a slight space is normally provided between the ledge 20 and an inserted circuit board 8 to accommodate small variations in the size of circuit boards 8 and variations in the extent to which the leading edge of a circuit board 8 will be accepted into the connector 9. The space provided must not, however, be so great that movement of the circuit board 8 within the space is sufficient to disconnect the electrical connection between the board 8 and the connector 9.

In the foregoing manner, the circuit boards 8 are held in the assembly without the necessity of using screws to obtain the positive locking provided by the lugs 21 and the latch members 14. With the positive locking provided by the present invention, the need for frictional engagement between the circuit boards 8 and the channels 6 is eliminated. Hence, the corresponding wear of frictionally engaged parts is likewise eliminated and the boards may be inserted or removed as often as required with little, if any, reduction in the effectiveness of the latch members 14.

From this description it will be seen that the present invention provides a circuit board assembly with a latch member that satisfies the dual objectives of positively locking circuit boards in the assembly when they are meant to be so secured, but allowing them to be readily removed from the assembly when that is required.

I claim:

1. In a circuit board assembly including parallel support bars which mount a set of two spaced guide rails, and an electrical connector disposed at one end of said set of guide rails, said guide rails having mirrored channels adapted to receive a circuit board to be inserted in said electrical connector, the combination therewith of:
   - a lug on the end of one of the guide rails opposite said electrical connector; and
   - a latch member independent of the circuit board and pivotally attached to the support bar for said one guide rail, said latch member including a ledge and a hook adapted to releasably engage said lug, said latch member being movable by pivoting on the support bar between an open position and a closed position in which said hook engages said lug and said ledge overlies the end of the channel in said one guide rail to prevent withdrawal of an inserted circuit board.

2. A circuit board assembly in accordance with claim 1 wherein said latch member includes a mounting portion having yieldable, incurved, opposing fingers with ends that are adapted to be forced apart to allow said fingers to snap over and around said support bar;
   - and wherein said lug projects into the path of travel of said hook as said latch member is pivoted on said support bar, said fingers of said mounting portion being adapted to yield so that said hook may be forced past said lug.

3. In a circuit board assembly including parallel support bars which mount a pair of sets of two spaced guide rails, and an electrical connector disposed at one end of each set of guide rails, the guide rails of each set having mirrored channels adapted to receive a circuit board to be inserted in said electrical connector, the combination therewith of:
   - an arm on the end of each guide rail opposite said electrical connector, said arm having a lug protruding from one side; and
   - a latch member independent of the circuit board and having a stem with a mounting portion at one end which is pivotally attached to the support bar between said pair of sets of guide rails, and a latch portion having a ledge and a pair of hooks adapted to releasably engage said lugs of the guide rails disposed on both sides of said stem, said latch member being movable by pivoting on the support bar between an open position and a closed position in which said hooks engage said lugs and said ledge overlies the ends of the channels of said guide rails disposed on both sides of said stem to prevent withdrawal of inserted circuit boards.

4. A circuit board assembly in accordance with claim 3 wherein there are a plurality of said pairs of sets of guide rails and there are a plurality of said latch members, two of said latch members being disposed between each of said pairs of sets of guide rails.

5. A circuit board assembly in accordance with claim 3 wherein said mounting portion of said latch member is formed of yieldable, incurved, opposing fingers with ends that are adapted to be forced apart to allow said fingers to snap over and around said support bar.

6. A circuit board assembly in accordance with claim 5 wherein said lugs project into the path of travel of said hooks as said latch member is pivoted on said support bar, said fingers of said mounting portion being adapted to yield so that said hook may be forced past said lug.

7. A latch member for a circuit board assembly which includes transverse support bars that mount pairs of sets of guide rails having mirrored channels adapted to receive printed circuit boards, said latch member being independent of the circuit boards and comprising a stem having a mounting portion at one end which is pivotally attached on one end of said support bars between said sets of guide rails, and a latch portion having a ledge and a pair of hooks adapted to releasably engage the ends of said guide rails disposed on both sides of said stem, said latch member being movable by pivoting on the support bar between an open position and a closed position in which said hooks engage the ends of said guide rails and said ledge overlies the ends of the channels of said guide rails disposed on both sides of said stem to prevent withdrawal of inserted circuit boards.

* * * * *